United States Patent [19]

Tiedje et al.

[11] Patent Number: 4,598,164
[45] Date of Patent: Jul. 1, 1986

[54] SOLAR CELL MADE FROM AMORPHOUS SUPERLATTICE MATERIAL

[75] Inventors: J. Thomas Tiedje, Lebanon; Benjamin Abeles, Princeton, both of N.J.

[73] Assignee: Exxon Research and Engineering Co., Florham Park, N.J.

[21] Appl. No.: 539,470

[22] Filed: Oct. 6, 1983

[51] Int. Cl.⁴ ............................................. H01L 31/06
[52] U.S. Cl. .................... 136/249; 136/255; 136/258; 357/2; 357/15; 357/30; 148/DIG. 160
[58] Field of Search .......... 136/249 TJ, 255, 258 AM; 357/2, 15, 30; 148/DIG. 160

[56] References Cited

U.S. PATENT DOCUMENTS

| | | | |
|---|---|---|---|
| 4,278,474 | 7/1981 | Blakeslee et al. | 136/249 TJ |
| 4,377,723 | 3/1983 | Dalal | 136/249 TJ |
| 4,492,810 | 1/1985 | Ovshinsky et al. | 136/255 |
| 4,521,447 | 6/1985 | Ovshinsky et al. | 427/45.1 |

OTHER PUBLICATIONS

Maruyama, "New Fabrication Techniques for Chalcogenide Semiconductors", *Amorphous Semiconductors, Technology & Devices*, Y. Hamakawa, ed. (North Holland, 1982), pp. 255-262.

Doehler, Amorphie Halbleiter mit Nipi-Dotierueberstrucktur, *Verk. dt. phys. Ges.* (VI), 17,745 (1982).

*Primary Examiner*—Aaron Weisstuch
*Attorney, Agent, or Firm*—Ronald D. Hantman

[57] ABSTRACT

A semiconductor device which includes an active region including a superlattice amorphous material wherein the energy gap has a predetermined value. A preferred embodiment of the device is a solar cell. In another embodiment of the present invention, the device is a tandem solar cell which includes a first active region including a superlattice material wherein the bandgap has a first predetermined value; a second active region including a second superlattice material wherein the bandgap has a second predetermined value different from said first predetermined value; a means for electrically interconnecting said first and second active regions such that current may flow between said first and second active regions.

11 Claims, 12 Drawing Figures

FIG. 4
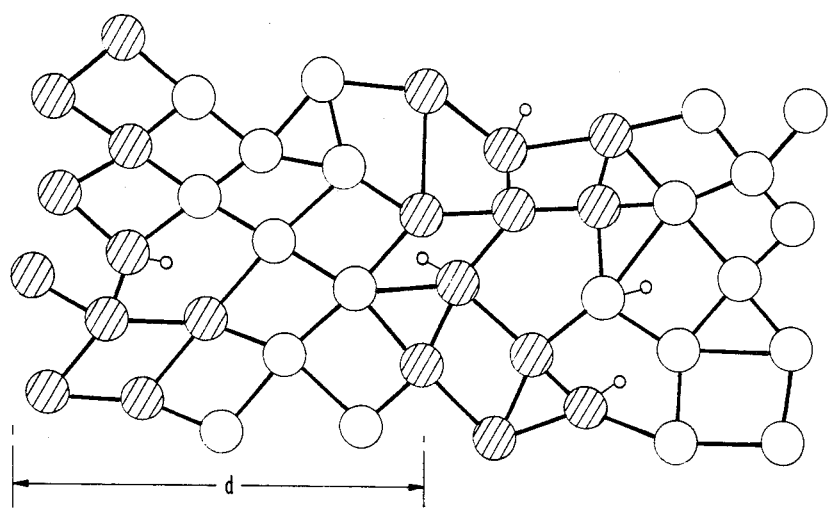
FIG. 5
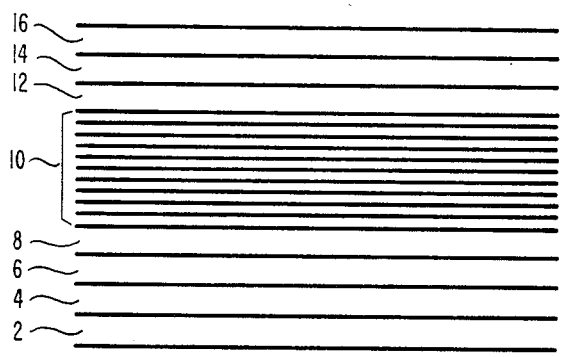
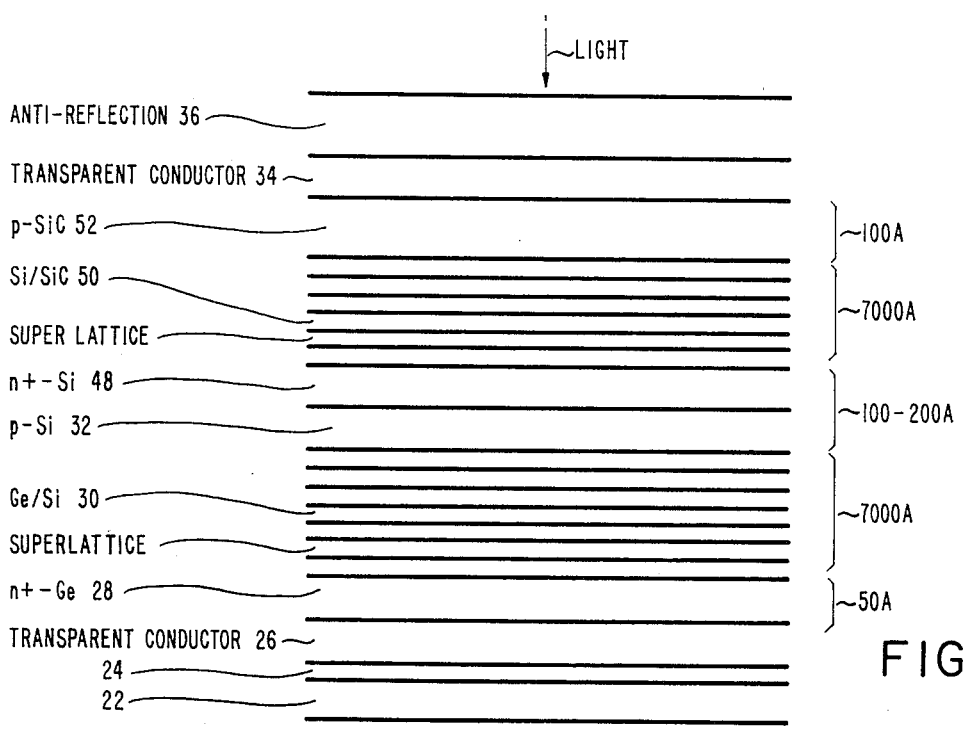
FIG. 6

SOLAR CELL MADE FROM AMORPHOUS SUPERLATTICE MATERIAL

BACKGROUND OF THE INVENTION

This invention relates to semiconductor devices comprised of amorphous superlattice material. In particular, this invention relates to solar cells comprised of amorphous superlattice material.

Solar cells which are comprised of one layer of active material having a single optical bandgap are sensitive only to a limited range of photon energies. Photons with energies below the optical bandgap energy are not absorbed at all. Moreover the energy of photons in excess of the optical bandgap energy is dissipated as heat in the solar cell. In order to increase the efficiency of energy conversion of solar cells, it is desirable to match the energy gap of the material to the solar spectrum. Therefore, being able to choose the energy gap of the material for a solar cell appropriate will maximize the efficiency of the cell.

Another way to increase the efficiency is to cascade active material into a multijunction solar cell so that each active layer is responsive to a different region of the solar spectrum; see e.g. U.S. Pat. No. 4,017,332, U.S. Pat. No. 4,179,702, and U.S. Pat. No. 4,255,211.

A major problem for multijunction (tandem) solar cells is that for best performance the optical bandgaps of the individual active materials must fall within fairly narrow limits set by the solar spectrum. Thus materials that otherwise would be desirable from the point of view of ease of thin film formation or electrical properties for example, may not be suitable in tandem solar cell applications because of their optical gap. One example is hydrogenated amorphous silicon (a-Si:H). This material, when prepared under conditions that give optimal electrical properties, has a bandgap (1.7-1.8 ev) that is too low for the top layer in a two junction cell (1.8-1.9 ev is optimal) and too high for the bottom layer in a two junction cell (1.2-1.3 ev optimal).

This problem could be solved in principle with different semiconductor materials, such as the silicon rich alloys a-Si$_{1-x}$Ge$_x$:H and a-Si$_{1-x}$C$_x$:H; however, the best electrical performance in these materials is usually obtained with the pure Si(x=0) composition.

The present invention is a semiconductor device which includes amorphous superlattice materials in which the individual sublayers are prepared under conditions that give the best electronic properties; and the bandgap is controlled by varying the thickness of the individual sublayers.

BRIEF DESCRIPTION OF THE FIGURES

FIG. 4 is a schematic diagram of the position of the individual atoms in the superlattice structure of the present invention.

FIG. 5 shows a schematic diagram of a solar cell constructed according to the present invention using a single active superlattice.

FIG. 6 shows a schematic diagram of a tandem cell constructed according to the present invention using two active superlattices with each one having a different band gap.

SUMMARY OF THE INVENTION

The present invention is a semiconductor device which includes an active region including a superlattice amorphous material wherein the energy gap has a predetermined value. A preferred embodiment of the device is a solar cell.

In another embodiment of the present invention, the device is a tandem solar cell which includes a first active region including a superlattice material wherein the bandgap has a first predetermined value; a second active region including a second superlattice material wherein the bandgap has a second predetermined value different from said first predetermined value; a means for electrically interconnecting said first and second active regions such that current may flow between said first and second active regions.

DESCRIPTION OF THE PREFERRED EMBODIMENT

The preferred embodiment of the present invention is a solar cell whose active region includes an amorphous superlattice: a multilayered amorphous material. Before discussing the solar cell, the superlattice material and its preparation are discussed.

SUPERLATTICE MATERIAL

Figure 3:
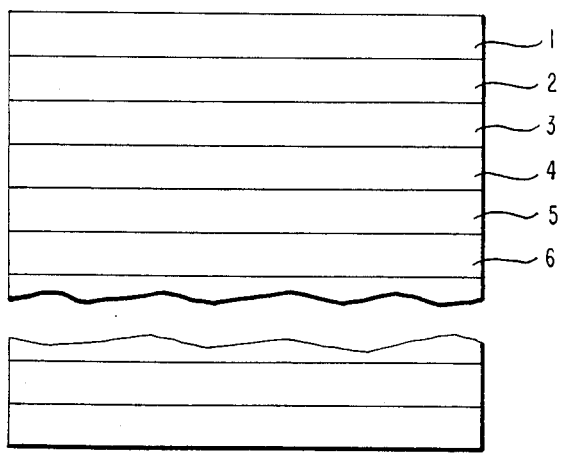
FIG. 3 is a schematic diagram of a superlattice structure.

An amorphous superlattice is a multilayered material whose layers are thin sheets of semiconducting or insulating tetrahedrally bonded amorphous material where the material is formed from tetrahedrally bonded elements or alloys containing said tetrahedrally bonded elements. Each layer is less than about 1500 A thick. In a preferred embodiment, the entire layered structure is a thin film material, that is, a material that is less than about 10 microns thick. Referring to FIG. 3, the first and alternate layers 1, 3, 5 of the structure have the same given composition while the second and alternate 2, 4, 6 . . . have the same composition different from the given composition of layers 1, 3, 5 . . . . Therefore, the spatial repeat distance of the material is the thickness of layer 1 plus layer 2. That is, layer 3 plus layer 4 is a repeat of layer 1 plus layer 2, etc.

The optical bandgap (as discussed below) of the superlattice differs from that of materials comprising the individual layers. In a preferred embodiment, the repeat distance is less than about 1000 A.

Figure 1:
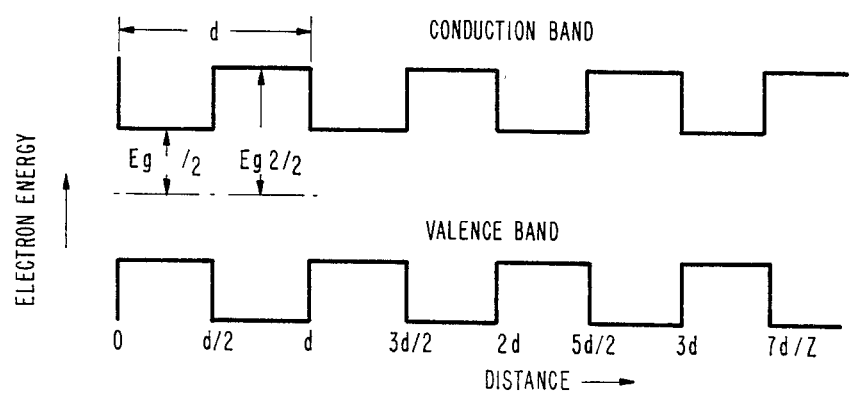
FIG. 1 shows a schematic energy band diagram for a semiconductor superlattice material, in which the compositional modulation is due to alloying or other gross compositional variation.
Figure 2:
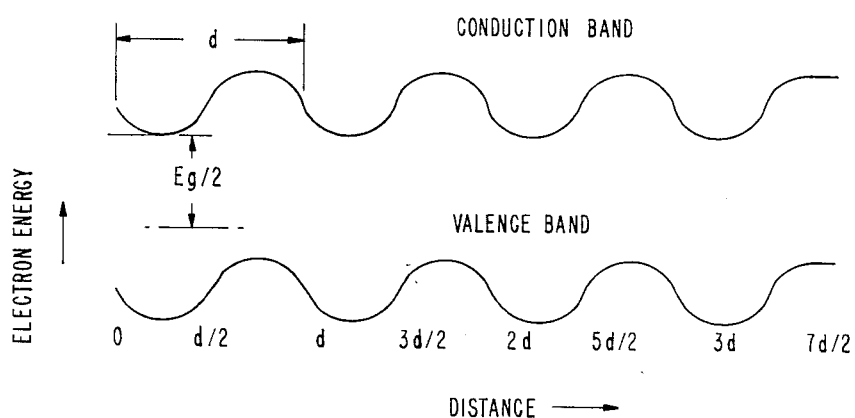
FIG. 2 shows an energy band diagram for a semiconductor superlattice material in which the compositional modulation is associated with doping.

A description of the electronic energy levels in terms of well defined E vs k relations, where E is the electronic energy and k is its wave vector, is not possible in amorphous semiconductors in the same way as it is in crystalline semiconductors. Nevertheless, some general features of the electronic energy level spectrum are known to be the same in both crystalline and low defect density amorphous semiconductors. For example, both types of semiconductors have a gap in the density of states between a broad distribution of filled levels (the valence band) and a broad distribution of empty levels (the conduction band). In crystals these energy bands have relatively sharp edges, broadened only by the thermal motion of the crystal lattice. In amorphous semiconductors the density of states edges are broader, being broadened by the structural disorder of the amorphous network in addition to the thermal motion of the atoms. The width of the low energy absorption tail of the optical absorption edge is one measure of the sharpness of the band edges in amorphous or crystalline semiconductors. In any case, an objective measure of the position of the band edges can be defined for both crystalline or amorphous semiconductors by, for example, the energy at which the density of states of the bulk material drops to $10^{20}$ cm$^{-3}$ev$^{-1}$. In this sense, energy band diagrams such as those shown in FIGS. 1 and 2, as described above can equally well be applied to amorphous and crystalline semiconductors. The modulation in the band edge energies illustrated in FIGS. 1 and 2 is obtained by modulation of the thin film composition.

The interfacial regions between the layers of the composition of matter of the present invention are substantially defect free. Referring to FIG. 4, it shows a schematic diagram of the lattice structure of the present invention in which the atoms of the alternating layers are indicated by light and dark circles and hydrogen atoms by smaller light circles. The period of the structures is d. As indicated in FIG. 4, there are substantially no dangling bonds to give rise to defects at the interfaces. As is well known in the art, hydrogen incorporated into the structure has a beneficial effect of reducing the density of dangling bonds.

Examples of amorphous semiconducting and insulating materials that can be fabricated into amorphous semiconductor superlattices according to this invention, can be divided into two classes:

(1) Group IVA Elements and Alloys, including:
a-Si:H, a-Ge:H, a-Si$_{1-x}$C$_x$:H, a-Si$_{1-x}$Ge$_x$:H, a-Si$_{1-x}$N$_x$:H, a-Si:hd 1$-x$Sn$_x$:H, a-Si$_{1-x}$O$_x$:H, a-C:H (tetrahedrally coordinate), a-Si$_{1-x-y}$O$_x$N$_y$:H, plus alloys and halogenated (F, Cl) versions of the hydrogenated materials listed (e.g. a-Si$_{1-x-y}$Ge$_x$Sn$_y$:H:F).

(2) Group IVA Elements and Alloys Doped with Groups IIIA and VA Elements

Suitable n type dopants include N, P, As, Sb, and suitable p type dopants include B, Al, Ga, In, Tl.

As used herein, the subscripts are the atomic fractions of the elements in the material. For example, if x=2/3, then a-Si$_{1-x}$O$_x$:H is a-Si$_{1/3}$O$_{2/3}$:H which is a-SiO$_2$:H.

Layers 1, 3, 5 . . . and layers 2, 4, 6 . . . may comprise any two of the materials where both are selected from the same class, e.g. a-Si:H/a-Si$_{1-x}$N$_x$:H or n-doped a-Si:H/p-doped a-Si:H.

In addition the alternating layers may include one material from class 1 alternating with a material from class 2, e.g. a-Si:H/n-doped a-Si$_{1-x}$N$_x$:H.

The composition of the present invention also includes layered materials of the form n-i-p-i-n-i-p-i, where n and p are n-doped and p-doped material derived from an undoped amorphous semiconductor material, i, by the addition of small concentrations of n and p-type dopant, respectively. In this case, each layer 1, 3, 5 . . . is considered to be n-i and each layer 2, 4, 6 . . . is considered to p-i so that the spatial repeat distance is the thickness of n-i-p-i.

The composition of matter of the present invention also includes layered materials where the composition of each layer is modulated cross the layers. For example, if the alternating layers are a-Si:H and a-Ge:H alloys, the transition from a-Si:H to a-Ge:H and from a-Ge:H to a-Si:H may occur gradually over an individual layer thickness starting with a-Si:H, gradually increasing the percentage of a-Ge:H until it is all a-Ge:H. In the next adjacent layer, the percentage of a-Si:H is increased until it is all a-Si:H. All succeeding layers repeat this sequence.

The materials in the two groups can be prepared by glow discharge decomposition of gaseous mixtures of volatile hydrides, fluorides, or chlorides or of the elemental gases themselves in the case of $O_2$, $N_2$, $Cl_2$, and $F_2$, as described below.

PREPARATION OF SUPERLATTICE MATERIAL

There are several deposition processes that are known to produce low defect density amorphous semiconductors. These include plasma assisted chemical vapor deposition (PCVD), low temperature CVD, and sputtering. Low temperature CVD is restricted to reactive gases that decompose at relatively low temperature, such as for example Si$_2$H$_6$. Sputtering has the advantage of being capable of producing a wider variety of amorphous semiconductor materials that can be made by PCVD or CVD; however, sputtered films usually contain more defects that PCVD films. We describe here a method for using PCVD to make amorphous semiconductor superlattices. To make amorphous semiconductor superlattices by CVD we simply omit the electric discharge used in the PCVD technique, although it is usually necessary to increase the substrate temperature to maintain the same deposition rate. To make amorphous semiconductor superlattices by sputtering it is possible to modify the technique (A. H. Eltoukhy and I. E. Greene, *J. Appl. Phys.* 50, 505(1979)) for making crystalline semiconductor superlattices by changing the deposition conditions (e.g. substrate temperature, gas pressure, and addition of H$_2$ to the plasma discharge) to produce hydrogenated amorphous rather than crystalline semiconductors.

Figure 8:
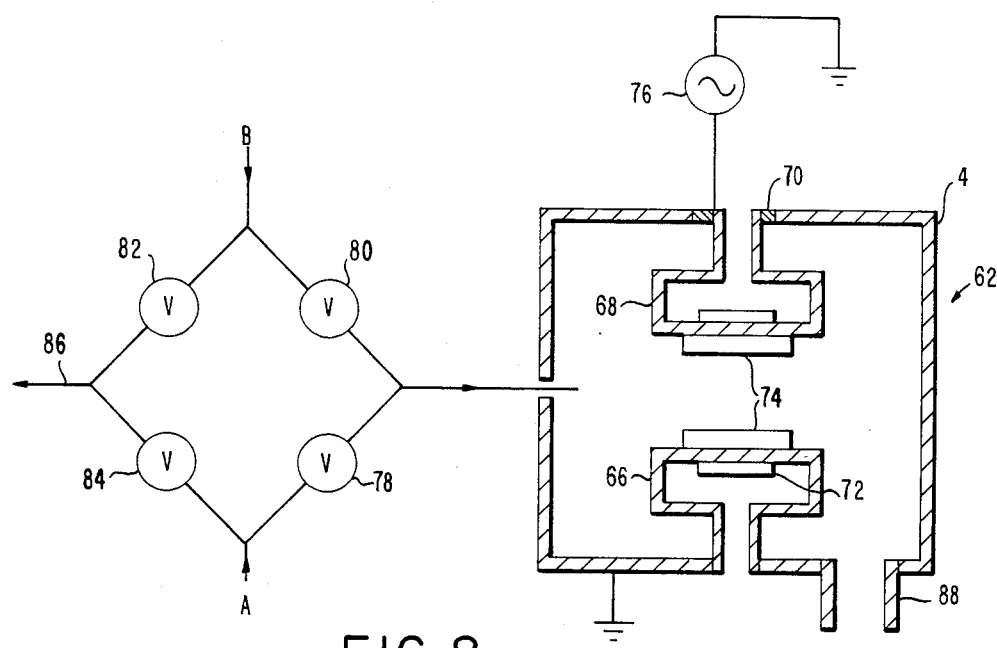
FIG. 8 is a schematic diagram of a plasma assisted chemical vapor deposition reactor.

Referring to FIG. 8, a PCVD apparatus for carrying out the fabrication of the superlattices material of the present invention is designated as 62. The PCVD apparatus includes a vacuum chamber 4 typically of stainless steel. In the vacuum chamber 4 are electrodes 66 and 68. Electrode 66 is grounded and referred to as the anode. Electrode 68 is insulated from the stainless steel chamber by insulator 70 and is referred to as the cathode. Flat heaters 72 are contained in the electrodes. Substrates 74 which can be insulators such as quartz or metals such as stainless steel are placed in good thermal contact with the electrodes.

The plasma is produced by a low power (5–10 W) RF (13.5 Mhz) discharge, by means of an RF generator 76 connected to the cathode. To deposit layered films the composition of the gas in the reactor 62 is changed periodically by opening and closing alternately pneumatic valves 78 and 80 to admit gas A or gas B into the reactor.

In order to avoid setting up pressure transients through the opening and closing of valves 78 and 80 the gases A and B are alternatively shunted into a ballast pump 86 by opening and closing valves 82 and 84 in phase with valves 78 and 80, respectively. The gases are pumped continuously out of the reactor by a pump through outlet 88.

To achieve abrupt changes in composition between adjacent layers requires that the time it takes to change gases in the reactor (molecular residence time) be short compared to the time it takes to grow a monolayer. The molecular residence time R is given by $$R = \frac{V_p}{F_o P_o}$$

where V is the volume of the reactor, p is the gas pressure in the reactor, and $F_o$ is the gas flow rate at standard pressure $P_o$. R can be varied over a wide range of values. In our experiments we have used V=30 liters, p=30 m torr, and Fo=0.1 liter/min, which gives R=1 sec. With a typical deposition rate of 1 Å/sec., the transition from one layer to the next takes place over a distance of less than a single atomic layer. The sublayer thickness is given by the product of the deposition rate and the flow period of the gas. The thickness of the sublayers can be varied from a submonolayer to thousands of angstroms.

Example of amorphous semiconductor superlattice that have been produced include:
a-Si:H/a-Ge:H
a-Si:H/a-Si$_{1-x}$N$_x$:H
a-Si:H/a-Si$_{1-x}$C$_x$:H The a-Si:H sublayers were made from pure SiH$_4$. The a-Ge:H sublayers were made from a mixture of 10% GeH$_4$+90% H$_2$. The a-Xi$_{1-x}$C$_x$:H sublayers were made from a mixture of 50% SiH$_4$+50% CH$_4$. The a-Si$_{1-x}$N$_x$:H layers were made from a mixture of 20% SiH$_4$+80% NH$_3$. The substrate temperatures were in the range 180°–250° C.

Amorphous semiconductor n-i-p-i, p-i-p-i, p-n-p-n, n-i-n-i superlattice structures can be formed by any of the methods described above by changing periodically the dopant concentration in the gas. For example, by flowing into the reactor first SiH$_4$+1% PH$_3$, then SiH$_4$, and then SiH$_4$+1% B$_2$H$_6$ followed by pure SiH$_4$, and repeating this sequence periodically we obtain an amorphous semiconductor n-i-p-i superlatice.

SUPERLATTICE SOLAR CELLS

A schematic diagram of a solar cell with a superlattice active material is shown in FIG. 5. The cell includes a substrate 2 which comprises an electrically insulating material such as glass. A layer of reflecting material 4, such as Ag, is deposited on the substrate 2 by one of several known deposition methods. A transparent conductor 6 is similarly deposited onto the reflecting layer 4. The transparent conductor 6 is any material which forms an ohmic contact with the adjacent semiconductor layer 8 such as SnO$_2$ or In$_x$Sn$_y$O. The purpose of layer 6 is to act as a diffusion barrier to inhibit chemical reaction between layers 4 and 8.

Layer 8 is an n-doped contact lyaer. This layer is deposited by plasma assisted chemical vapor deposition of a reactive gas, which is a preferred embodiment will be germane or silane gas or a mixture of SiH$_4$ and GeH$_4$ doped with 0.1–1% PH$_3$. The thickness of the layer is between 50 and 500 Å.

Layer 10 is an amorphous multi-layered superlattice material whose preparation has been described above.

Layer 12 is a p-doped amorphous contact material made from the higher bandgap component of the superlattice material for example. The thickness of the layer is 80–200 Å. This layer forms a p-type hereto-contact to the front surface of the solar cell, which will improve both the response of the solar cell at short wavelengths and increase the output voltage. The three layers 12, 10, and 8 form the equivalent of a PIN semiconductor device (see U.S. Pat. No. 4,064,521).

The layers 8, 10, and 12 are deposited in a plasma reactor with gas pressure 30–300 mtorr, gas flow 100 cc/min and substrate temperature 180°–250° C.

Layer 14 is a transparent conductor such as SnO$_2$ or In$_x$Sn$_y$O which forms an ohmic contact with the adjacent semiconductor layer 12. In a preferred embodiment, the cell also includes an anti-reflection coating 16 on the side of the cell toward the incident light and a textured back surface to enhance the absorption of near infrared light.

Other device structures, for example n-i-p-i . . . structures can be fabricated in an analogous way from superlattice materials.

Referring to FIG. 6, it shows a schematic diagram of a two junction tandem solar cell. In this case, the substrate 22, reflecting surface 23, bottom transparent conductor 26, top transparent conductor 34 and antireflection layer 36 correspond to substrate 2, reflecting surface 4, bottom transparent conductor 6, top transparent conductor 14 and antireflection layer 16, respectively in FIG. 5. However, instead of one active region, layers 8, 10, and 12 of FIG. 5, there are two active regions 28, 30, 32 and 48, 50, 52. Each region is the equivalent of a PIN junction. The second active region may be formed of crystalline material. Alternately, the second active region may be formed of a second superlattice. In this case, however the superlattice regions 30 and 50 are fabricated so that the bandgap of each region is such that each active layer is responsive to different parts of the solar spectrum. The two active regions 30 and 50 are interconnected so that current can flow from one to the other. One method is that layers 32 and 48 are similar materials but heavily doped with opposite polarity so as to form a tunnel junction (see U.S. Pat. No. 4,179,702). The interconnection means may include recombination sites for carriers such that the recombination of electrons and holes will cause said interconnecting means to act as a low resistance ohmic contact. Superlattices that may be used are a-Ge:H(20A)/a-Si:H (30 A) (see FIGS. 9 and 10) for the low band gap active region (1.2–1.3 ev) and a-Si:H (20 A)/a-Si$_{1-x}$C$_x$:H (20 A) (See FIG. 7) for the high band gap active region (1.8–1.9 ev). FIG. 6 shows a particular example of a tandem solar cell.

Figure 7:
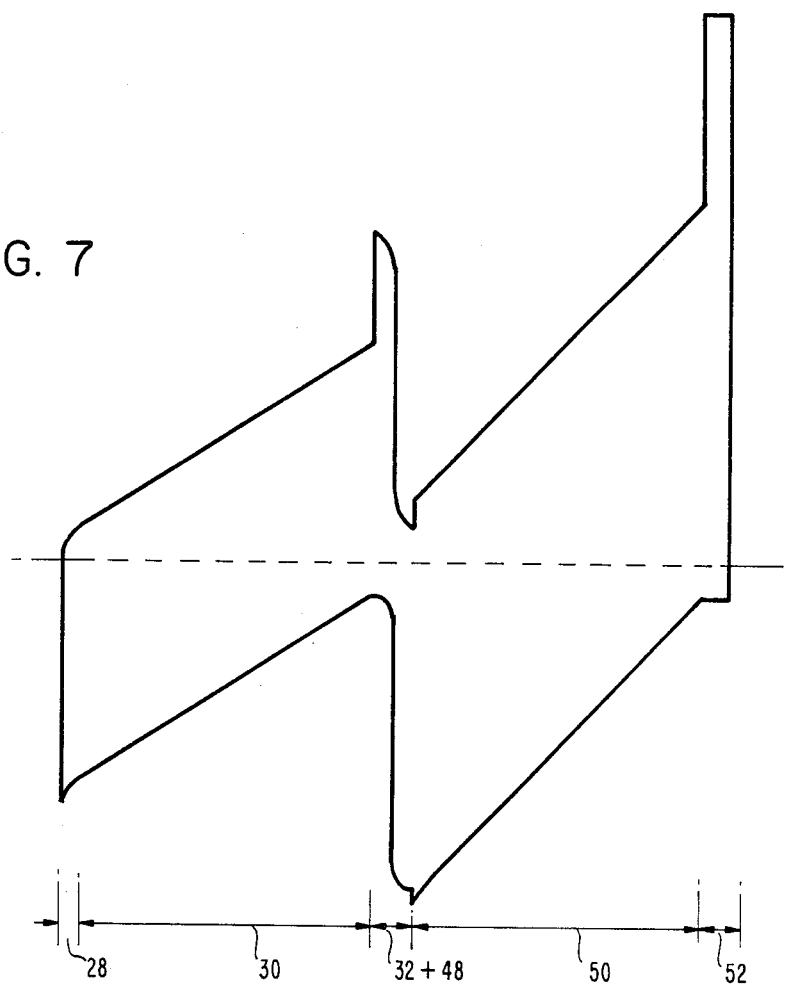
FIG. 7 is an energy band diagram of a tandem cell of two superlattices.

FIG. 7 shows an energy band diagram for the tandem amorphous superlattice solar cell shown in FIG. 6. The conduction and valence band edges for the a-Ge:H/a-Si:H and a-Si:H/a-Si$_x$C$_{1-x}$:H superlattice materials indicated by 30 and 50 respectively in FIG. 7 are effective band edges, that are meant to represent the position of the conduction and valence band mobility edges. At the same time, it is understood that the electronic potential that determines the position of the conduction and valence bond mobility edges has the oscillatory form indicated by FIG. 1 and FIG. 2 for example. The effective band edges are derived from the optical absorption edges measured on the superlattices as for instance in FIGS. 9, 10, and 11. The regions of the energy band diagram of FIG. 7 that correspond to the layers of FIG. 6 are designated by like numerals. corresponding to the tandem solar cell in FIG. 6.

OPTICAL PROPERTIES OF SUPERLATTICE AMORPHOUS SEMICONDUCTORS

Figure 9:
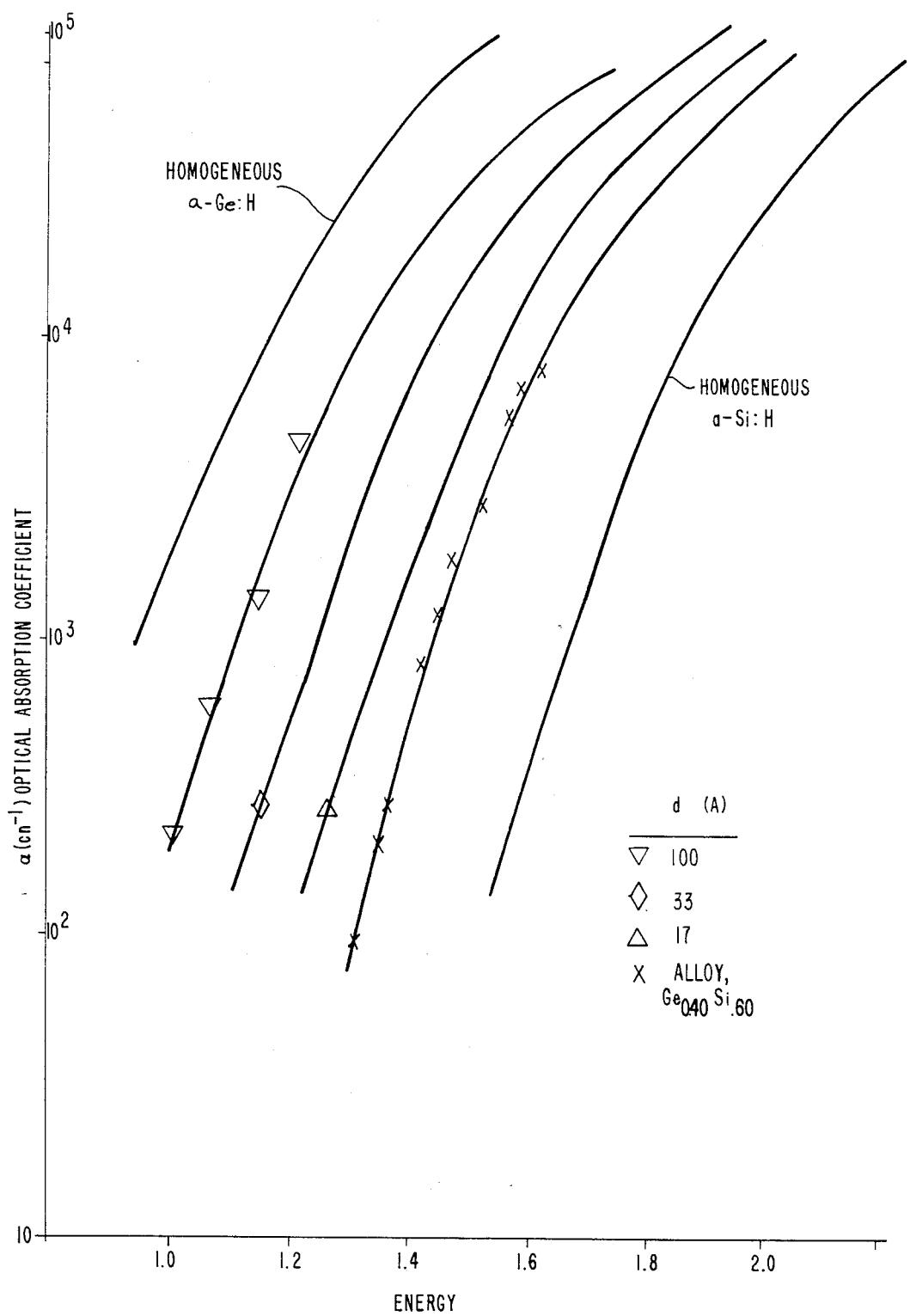
FIG. 9 shows optical absorption coefficients for a-Ge:H/a-Si:H superlattice materials, with the ratio of the a-Ge:H to the a-Si:H sublayer thickness held constant.
Figure 10:
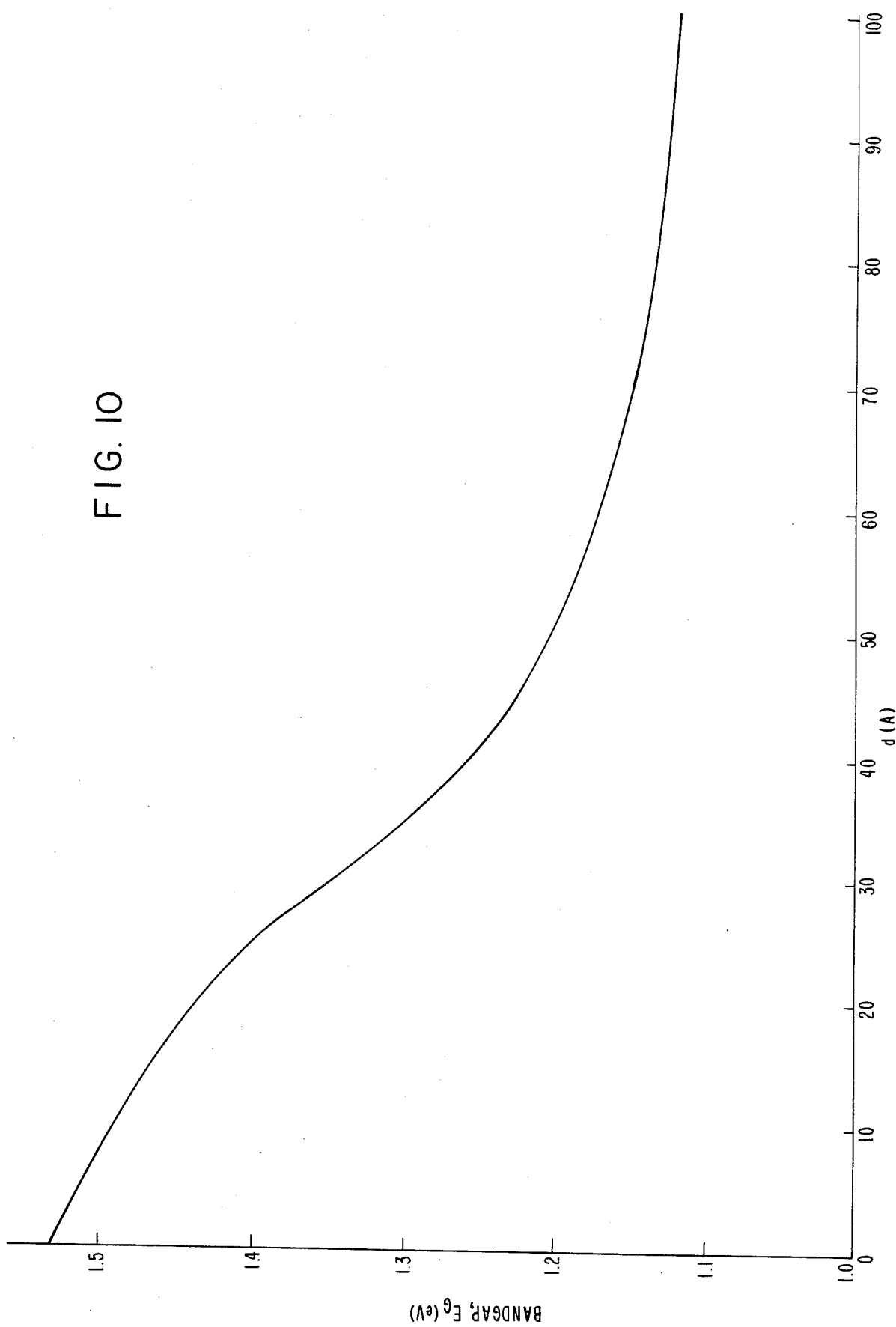
FIG. 10 shows the optical band gap $E_G$ as a function of the superlattice repeat distance d.
Figure 11:
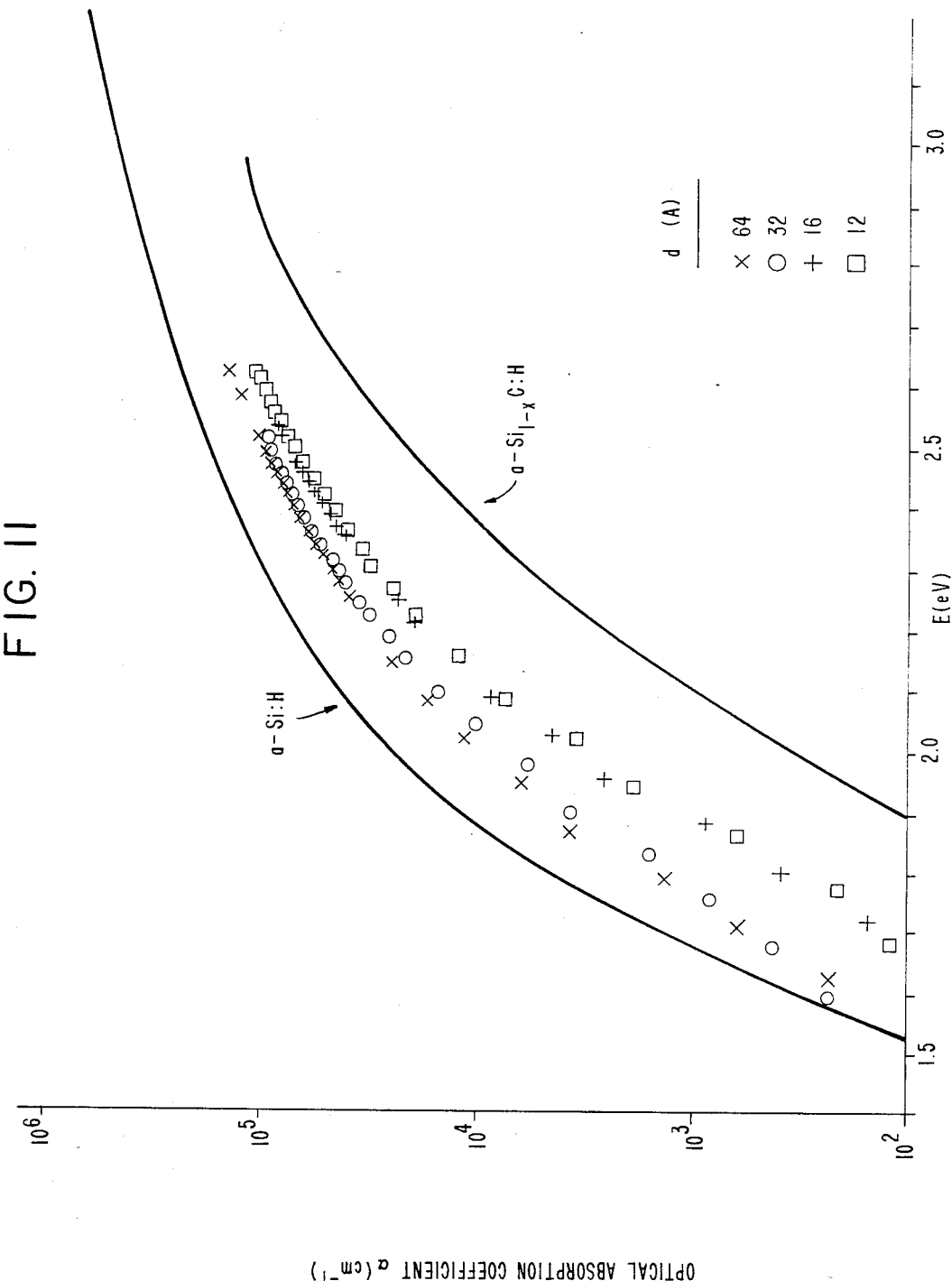
FIG. 11 shows optical absorption coefficient of a-SiiH/a-Si$_{1-x}$C$_x$:H superlattices.

A series of a-SiH/a-Ge:H superlattice materials with fixed ratio of a-Si:H sublayer thickness to a-Ge:H sublayer thickness has been fabricated. The optical absorption $\alpha$ as a function of photon energy E for this series of materials is shown in FIG. 9 along with the optical absorption for a-Si:H and a-Ge:H. We define an optical gap $E_G$ by fitting $\alpha$ as a function of E with the relation $(\alpha E)^{\frac{1}{2}}=$ constant $(E_G-E)$ where E is the photon energy as is customary in the field of amorphous semiconductors. The germanium to silicon ratio in the layered material and the $Ge_xSi_{1-x}$ alloy in FIG. 9 is given approximately by $Ge_{0.4}Si_{0.6}$. (The numbers in the FIG. 9 indicate the repeat distance of the superlattice structure.) The bandgap $E_G$ in these materials as shown in FIG. 10 increases through the 1.2-1.3 ev region as the superlattice repeat distance d decreases with no increase in the width of the absorption tail, a quantity which is one measure of the electronic quality of the material. A bandgap of 1.2-1.3 ev is optimal for the low bandgap cell in a two junction amorphous tandem cell. The superlattice can thus be tuned to the desired value of $E_G$ by changing the layer thicknesses. A similar result is obtained with the a-Si:H/a-Si$_{1-x}$C$_x$:H superlattice as is shown in FIG. 11, where the absorption edge also shifts to higher energy with decreasing superlattice period also without a significant change in the width of the absorption tail. In this case the a-Si:H and a-Si$_{1-x}$C$_x$:H layers had the same thicknesses and $E_G$ could be tuned from about 1.8—2 ev. This bandgap range is optimal for the top cell in a two junction amorphous tandem cell.

Figure 12:
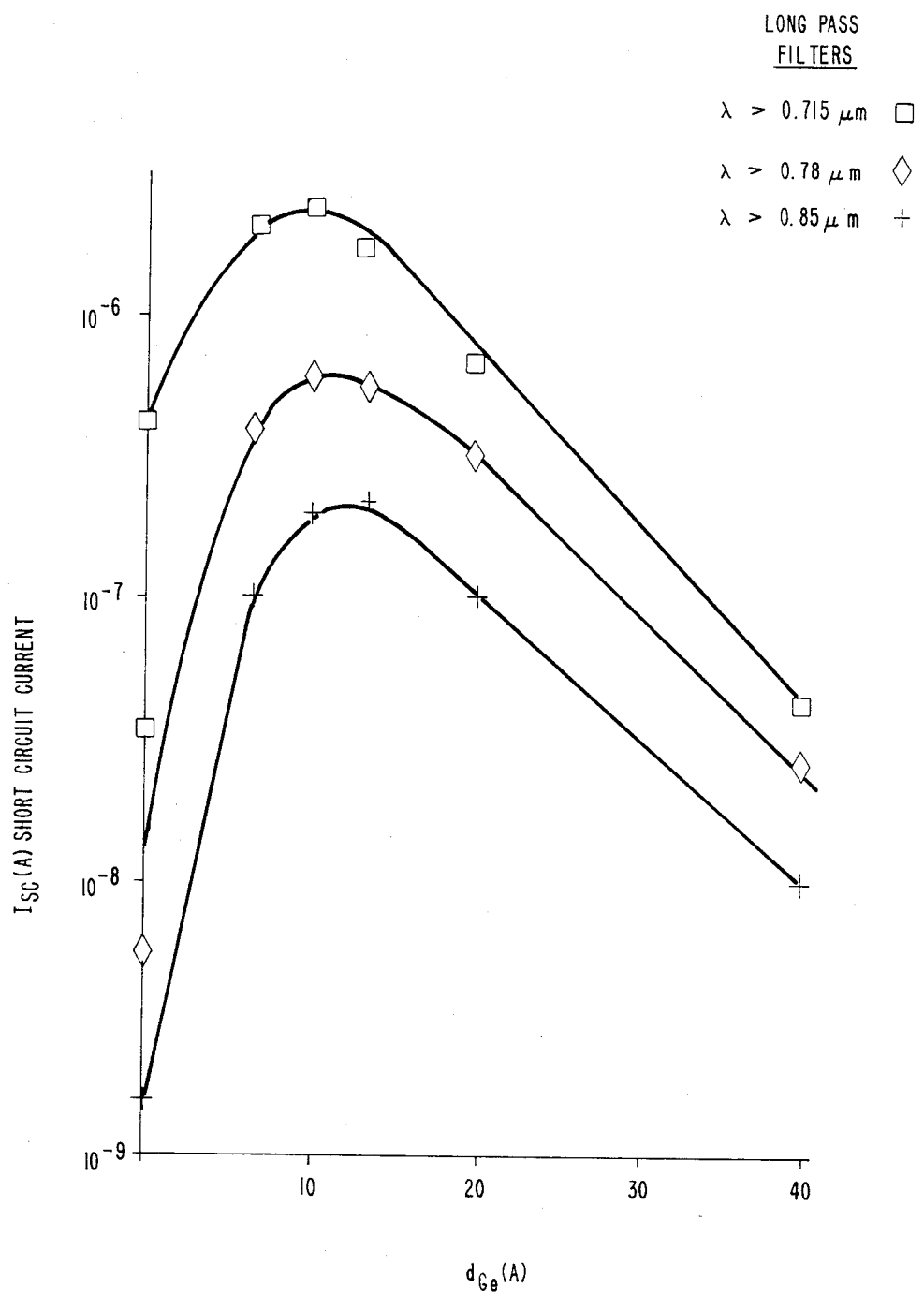
FIG. 12 shows the short circuit current of a Schottky barrier a-Ge:H/a-Si:H superlattice solar cell as a function of the a-Ge:H layer thickness measured with a tungsten lamp simulating 1 sun filtered by three different long wavelength pass filters.

As a further measure of the electronic quality of the material, Schottky barrier solar cell structures have been fabricated from a-Ge:H/a Si:H materials and the relative short-circuit current measured with a tungsten lamp and three different long pass infrared filters to simulate its performance in a tandem cell where the top layer absorbs the short wavelength part of the solar spectrum. The solar cell structure in that case is like that in FIG. 5, except that layers 12, 14, and 16 have been replaced by a semitransparent 80 Å thick platinum contact which acts to form a junction similarly as the p+ layer 12. The resulting short circuit current, $I_{SC}$, as a function of the a-Ge:H sublayer thickness $d_{GE}$ in the superlattice material, is plotted in FIG. 12. The points on the vertical axis correspond to an a-Ge$_{0.36}$Si$_{0.65}$:H alloy with about the same composition as the average composition of the superlattice material. Note that the material with repeat distance in the 10-30 Å range has the best performance. The performance falls off for very thin sublayer thicknesses in part because of the increase in optical gap and at large sublayer thicknesses because of the decrease in the diffusion length of the photogenerated electron-hole pairs.

If the thickness of the larger gap component in the superlattice is too great (>30 Å), the electron or hole transport in the direction normal to the sublayers may be hindered by the internal potential barriers which are roughly equal to the difference in the bandgaps of the two components. For sublayers <20 Å electron tunneling through the barriers will be rapid, so that electron transport should be band-like and unhindered. Hole transport is not expected to be a problem in a-Ge:H, a-Si:H, a-SiC:H superlattices because the valence bands in these materials are believed to be quite closely matched in energy although the exact band alignments for these materials are not fully understood at present.

What is claimed is:

1. A semiconductor device comprising:
    a first photovoltaic cell which includes a first superlattice consisting essentially of a first multi-layered amorphous semiconductor material having a predetermined composition wherein the effective energy gap has a predetermined value which can be obtained by varying the thickness of the individual layers while maintaining said composition constant, said first superlattice material having an upper and lower surface, a first layer of n-doped amorphous semiconductor material forming a heterojunction with said lower surface, and a first layer of p-doped amorphous semiconductor material forming a heterojunction with said upper surface.

2. The semiconductor device of claim 1 further comprising:
    (a) a second photovoltaic cell in optical tandem with said first photovoltaic cell, and
    (b) means for electrically interconnecting said photovoltaic cell and said first superlattice such that current may flow therebetween, said interconnecting means being a layer of material adjacent to and between both of said photovoltaic cells.

3. The semiconductor device of claim 2 wherein said second photovoltaic cell and said means electrically interconnecting comprise:
    (a) a second superlattice consisting essentially of a second multi-layered amorphous semiconductor material wherein the effective energy gap has a second predetermined value different from said first predetermined value, said second superlattice having an upper and a lower surface,
    (b) a second layer of n-doped amorphous material forming a heterojunction with said lower surface of said second superlattice and a tunnel junction with said first p-doped layer,
    (c) a second layer of p-doped amorphous material forming a heterojunction with said upper surface of said second superlattice.

4. The semiconductor device of claim 3 wherein said first superlattice is a-Si:H/a-Ge:H superlattice and said second superlattice is a-Si:H/a-Si$_{1-x}$C$_x$:H.

5. The semiconductor device of claim 4 wherein said first p-doped layer and said second n-doped layer is the same amorphous material.

6. The semiconductor device of claim 5 wherein said amorphous material is a-Si:H.

7. The semiconductor device of claim 3 wherein said first effective energy gap is between 1.1 ev and 1.3 ev and said second effective energy gap is between 1.8 ev and 1.9 ev.

8. The semiconductor device of claim 3 wherein said first effective energy gap is between 1.8 ev and 1.9 ev and said second effective energy gap is between 1.1 ev and 1.3 ev.

9. The semiconductor device of claim 2 wherein said interconnecting means include recombination sites for carriers such that the recombination of electrons and holes will cause said interconnecting means to act as a low resistance ohmic contact.

10. The semiconductor device of claim 2 wherein said second photovoltaic cell comprises a crystalline material having a junction.

11. The semiconductor device of claim 2 wherein said second photovoltaic cell comprises a Schottky barrier.

* * * * *